(12) United States Patent
Eisert et al.

(10) Patent No.: US 7,242,025 B2
(45) Date of Patent: Jul. 10, 2007

(54) RADIATION EMITTING SEMICONDUCTOR COMPONENT HAVING A NITRIDE COMPOUND SEMICONDUCTOR BODY AND A CONTACT METALLIZATION LAYER ON ITS SURFACE

(75) Inventors: Dominik Eisert, Regensburg (DE); Stephan Kaiser, Regensburg (DE); Michael Fehrer, Bad Abbach (DE); Berthold Hahn, Hemau (DE); Volker Härle, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 59 days.

(21) Appl. No.: 10/356,109

(22) Filed: Jan. 31, 2003

(65) Prior Publication Data

US 2003/0141604 A1    Jul. 31, 2003

(30) Foreign Application Priority Data

Jan. 31, 2002    (DE) ............................... 102 03 809

(51) Int. Cl.
  *H01L 27/15*   (2006.01)
  *H01L 33/00*   (2006.01)
  *H01L 23/48*   (2006.01)
  *H01L 51/10*   (2006.01)
  *H01S 5/183*   (2006.01)

(52) U.S. Cl. ................ 257/79; 257/98; 257/103; 257/784; 257/758; 257/701; 257/700; 257/E51.026; 257/E55.056; 372/70; 372/75; 250/370.11

(58) Field of Classification Search ........ 257/E55.056, 257/E51.026, 89, 90, 95, 79, 700, 701, 758, 257/784, 99, 98, 103, 102, 96, 97, 86, E33.065, 257/E33.069, E33.028, E33.063, E33.043; 372/70, 75, 50.1, 99; 250/370.11

See application file for complete search history.

(56) References Cited

U.S. PATENT DOCUMENTS

| | | | | | |
|---|---|---|---|---|---|
| 4,444,992 | A | * | 4/1984 | Cox, III | 136/248 |
| 6,046,464 | A | * | 4/2000 | Schetzina | 257/96 |
| 6,287,947 | B1 | | 9/2001 | Ludowise | |
| 6,291,839 | B1 | | 9/2001 | Lester | |
| 6,303,405 | B1 | * | 10/2001 | Yoshida et al. | 438/46 |
| 6,323,059 | B1 | * | 11/2001 | Yoshida et al. | 438/106 |
| 6,365,427 | B1 | * | 4/2002 | Gauggel et al. | 438/22 |
| 6,473,885 | B1 | * | 10/2002 | Wallace | 716/4 |
| 6,475,923 | B1 | * | 11/2002 | Mitamura | 438/758 |
| 6,512,248 | B1 | * | 1/2003 | Takeuchi et al. | 257/81 |
| 6,531,405 | B1 | * | 3/2003 | Wegleiter et al. | 438/745 |

(Continued)

FOREIGN PATENT DOCUMENTS

DE    199 27 945 A1    3/2000

(Continued)

*Primary Examiner*—Alexander Oscar Williams
(74) *Attorney, Agent, or Firm*—Cohen Pontani Lieberman & Pavane LLP

(57) ABSTRACT

A radiation-emitting semiconductor component has a semiconductor body containing a nitride compound semiconductor, and a contact metallization layer disposed on a surface of the semiconductor body. In this case, the contact metallization layer is covered with a radiation-transmissive, electrically conductive contact layer. The radiation generated is coupled out through the contact metallization layer or through openings in the contact metallization layer.

48 Claims, 2 Drawing Sheets

U.S. PATENT DOCUMENTS

| | | | |
|---|---|---|---|
| 6,531,716 B2* | 3/2003 | Udagawa | 257/94 |
| 6,552,367 B1 | 4/2003 | Hsieh et al. | |
| 6,614,058 B2* | 9/2003 | Lin et al. | 257/99 |
| 6,693,352 B1* | 2/2004 | Huang et al. | 257/743 |
| 6,720,584 B2* | 4/2004 | Hata et al. | 257/98 |
| 6,787,814 B2* | 9/2004 | Udagawa | 257/101 |
| 6,794,690 B2* | 9/2004 | Uemura | 257/183 |
| 6,825,501 B2* | 11/2004 | Edmond et al. | 257/98 |
| 6,924,515 B2* | 8/2005 | Senda et al. | 257/189 |
| 6,936,863 B2* | 8/2005 | Udagawa et al. | 257/103 |
| 7,005,684 B2* | 2/2006 | Uemura et al. | 257/99 |
| 2001/0045562 A1* | 11/2001 | Uemura et al. | 257/79 |
| 2002/0074558 A1* | 6/2002 | Hata et al. | 257/89 |
| 2002/0145205 A1* | 10/2002 | Hirano et al. | 257/778 |
| 2003/0001162 A1* | 1/2003 | Udagawa | 257/79 |
| 2003/0039866 A1* | 2/2003 | Mitamura | 428/698 |
| 2003/0052323 A1* | 3/2003 | Takeuchi et al. | 257/81 |
| 2003/0098460 A1* | 5/2003 | Yasukawa et al. | 257/99 |
| 2003/0160257 A1* | 8/2003 | Bader et al. | 257/98 |
| 2003/0164502 A1 | 9/2003 | Baur et al. | |
| 2004/0056254 A1 | 3/2004 | Bader et al. | |
| 2004/0061115 A1* | 4/2004 | Kozawa et al. | 257/79 |
| 2004/0119085 A1* | 6/2004 | Bader et al. | 257/98 |
| 2004/0121602 A1* | 6/2004 | Maruyama et al. | 438/689 |
| 2004/0140474 A1* | 7/2004 | Ueda et al. | 257/79 |
| 2004/0149999 A1* | 8/2004 | Uemura et al. | 257/103 |
| 2004/0164310 A1* | 8/2004 | Uemura | 257/99 |
| 2005/0095737 A1* | 5/2005 | Edmond et al. | 438/22 |

FOREIGN PATENT DOCUMENTS

| | | | |
|---|---|---|---|
| DE | 100 17 758 A1 | | 12/2000 |
| DE | 100 49 573 A1 | | 5/2001 |
| DE | 100 26 255 A1 | | 11/2001 |
| DE | 101 07 472 A1 | | 12/2001 |
| JP | 9-129919 | | 5/1997 |
| JP | 9-129932 | * | 5/1997 |
| JP | 9-129933 | | 5/1997 |
| JP | 9129932 | | 5/1997 |
| JP | 10-173224 | * | 6/1998 |
| JP | 10173224 | | 6/1998 |
| JP | 10256602 A | | 9/1998 |
| JP | 11-17223 | | 1/1999 |
| JP | 11-177138 | | 7/1999 |
| JP | 2000 196 197 A | | 7/2000 |
| JP | 2000-196189 | | 7/2000 |
| JP | 2000-216431 | | 8/2000 |
| JP | 2000349339 A | | 12/2000 |
| JP | 2001-210867 | * | 8/2001 |
| JP | 2001210867 | | 8/2001 |

* cited by examiner

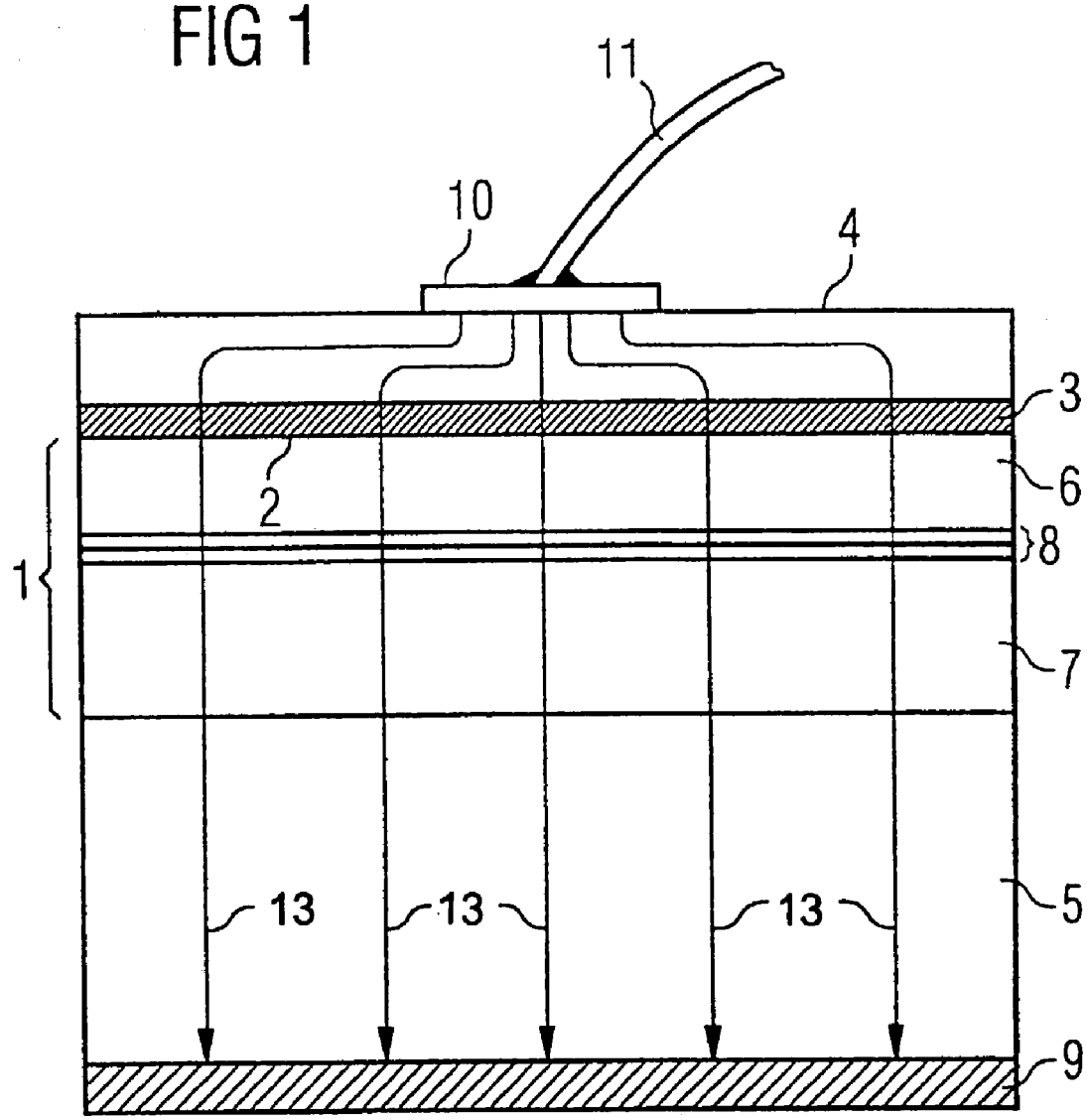

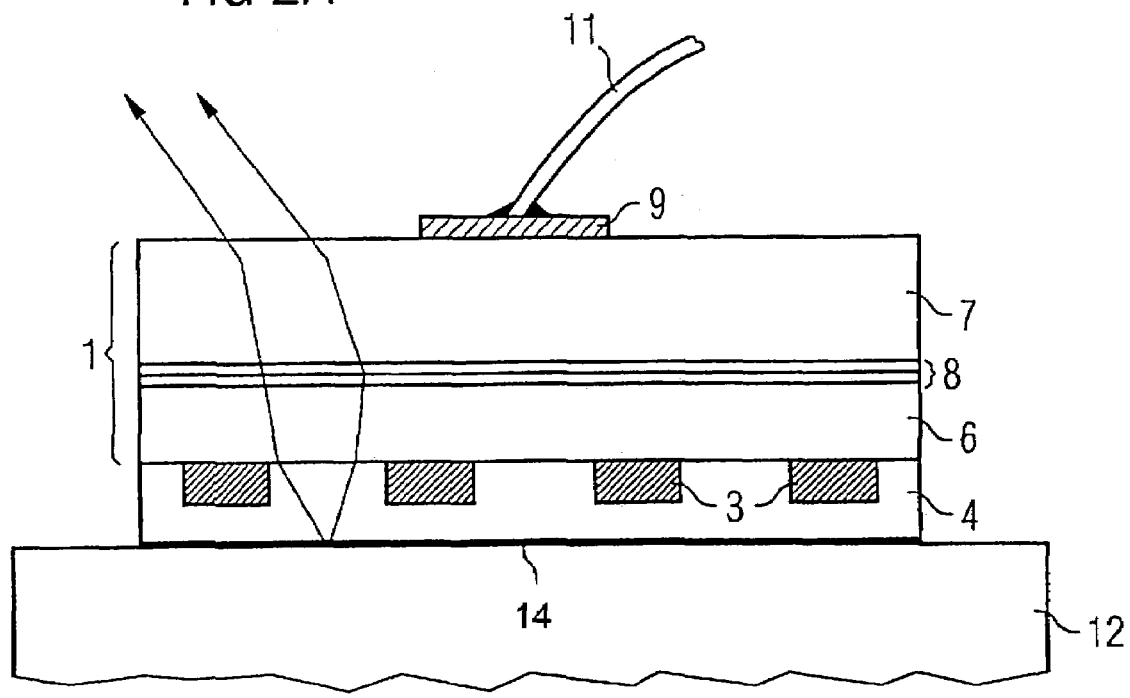
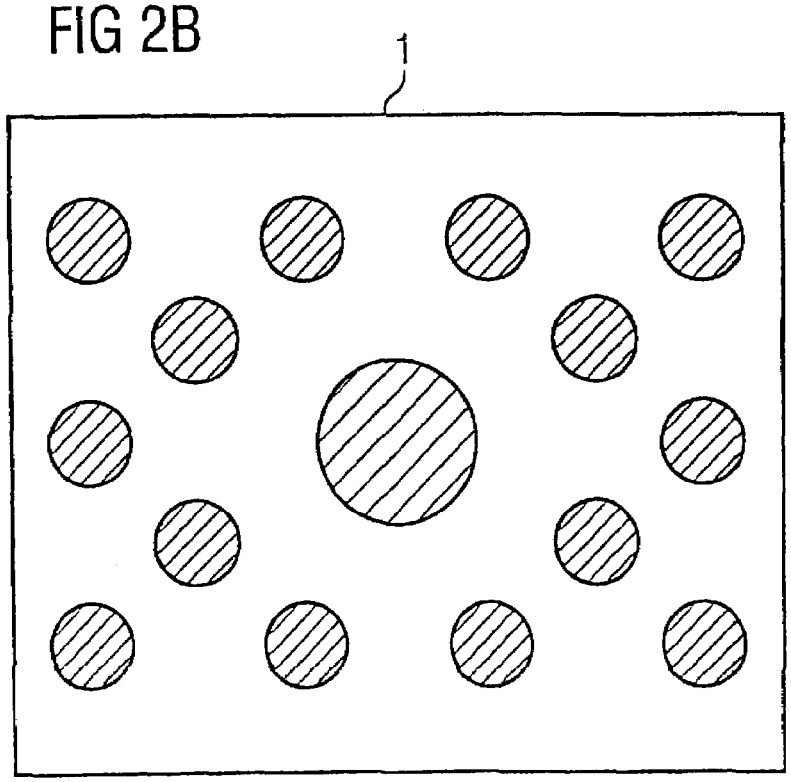

RADIATION EMITTING SEMICONDUCTOR COMPONENT HAVING A NITRIDE COMPOUND SEMICONDUCTOR BODY AND A CONTACT METALLIZATION LAYER ON ITS SURFACE

BACKGROUND OF THE INVENTION

Field of the Invention

The invention relates to a radiation-emitting semiconductor component. The radiation-emitting semiconductor component has a semiconductor body which contains a nitride compound semiconductor and which has a contact metallization layer on its surface.

Nitride compound semiconductors often have a comparatively low conductivity relative to the contact metallization layer. Increasing the conductivity entails technical problems particularly in the case of p-doped nitride compound semiconductors. Consequently, a homogeneous current distribution in the semiconductor body requires large-area contact metallization structures on the semiconductor body since a current expansion, i.e. a compensation of an inhomogeneous current distribution, takes place only to a small extent in the semiconductor body itself.

The associated large-area coverage of the semiconductor surface reduces the free semiconductor surface available for coupling-out in the case of radiation-emitting semiconductor components, so that the quantity of radiation that is coupled out decreases. Although the contact metallization layer can be made so thin that it is transmissive for the radiation to be coupled out, the electrical resistance rises as a result in the lateral direction, i.e. parallel to the semiconductor surface, so that a uniform distribution of the operating current, which is fed in for example at a central connection point via a wire connection, is no longer ensured. A non-uniform current distribution increases the risk of damage to the component on account of a local concentration of the operating current, which can lead to a thermal overload.

SUMMARY OF THE INVENTION

It is accordingly an object of the invention to provide a radiation-emitting semiconductor component that overcomes the above-mentioned disadvantages of the prior art devices of this general type, which has an improved contact metallization layer. In particular, it is an object of the invention to specify an improved contact metallization layer for a p-doped nitride compound semiconductor.

In a first embodiment of the invention, provision is made for forming a radiation-emitting semiconductor component having a semiconductor body containing a nitride compound semiconductor, a contact metallization layer being disposed on the surface of the semiconductor body, and the contact metallization layer being radiation-transmissive and being covered with a radiation-transmissive, electrically conductive contact layer.

The invention advantageously makes it possible to form very thin contact metallization layers with a correspondingly high transmission for the radiation generated in the semiconductor body. The reduced transverse conductivity on account of the small thickness of the contact metallization layer is compensated for by the electrically conductive and radiation-transmissive contact layer applied to the contact metallization layer. In this case, the transverse conductivity is to be understood as the electrical conductivity in a parallel direction with respect to the surface to which the contact metallization layer is applied.

In a second embodiment of the invention, provision is made for forming a radiation-emitting semiconductor component having a semiconductor body containing a nitride compound semiconductor, a contact metallization layer with a plurality of openings or in the form of a plurality of contact islands spaced apart from one another being disposed on the surface of the semiconductor body. The contact metallization layer is again covered with a radiation-transmissive, electrically conductive contact layer. In contrast to the first embodiment, in the case of the second embodiment, the radiation generated can exit from the semiconductor body through the openings in the contact metallization layer or between the contact metallization layer islands. A high degree of coupling-out is advantageously achieved in this way. The reduced transverse conductivity due to the structuring of the contact metallization layer is again compensated for by the contact layer covering the contact metallization layer.

In this case, in order to further increase the degree of coupling-out, it is advantageous in the case of the second embodiment, too, for the contact metallization layer to be formed such that it is radiation-transmissive. As an alternative, the contact metallization layer may also be radiation-nontransmissive even in the case of the second embodiment. This enables a larger thickness of the contact metallization layer and thus a higher mechanical stability, for example against scratches. Furthermore, the manufacturing tolerances are advantageously reduced with regard to the thickness of the contact layer.

Both embodiments of the invention combine the advantages of any high coupling-out of radiation on account of a radiation-transmissive and/or structured contact metallization layer, a uniform lateral current distribution by the electrically conductive contact layer and a low contact resistance.

In particular, metal layers containing platinum or palladium are suitable as the contact metallization layer. In comparison with conventional contact metallization layers, the contact metallization layer in the case of the invention can be embodied with a very small layer thickness of less than 20 nm, preferably less than 10 nm. Typically, in the case of the invention, platinum, nickel or palladium layers having a thickness of 5 nm are used for the contact metallization layer.

Preferably, the contact metallization layer and the contact layer are applied to a p-conducting, for example magnesium-doped or zinc-doped, region of the semiconductor body. The conductivity of p-conducting nitride compound semiconductors is comparatively low, so that a current expansion takes place only to a limited extent in p-conducting regions. Therefore, the current expansion in p-conducting regions is often inadequate in particular for components having a high operating current density, for example semiconductor lasers. Applying an electrically conductive contact layer in order to increase the transverse conductivity is particularly advantageous here.

Preferably, with regard to a current distribution that is as uniform as possible, a material whose transverse conductivity is higher than the transverse conductivity of the contact metallization layer is used for the contact layer. Zinc oxide, in particular, is suitable for this. Furthermore, it is also possible to use tin oxide, indium oxide or indium tin oxide (ITO).

In the case of the invention, a nitride compound semiconductor is to be understood as, in particular, nitride compounds of elements of the third and/or fifth main group of the periodic table of chemical elements, for example GaN, AlN, InN, $Al_xGa_{1-x}N$, $0 \leq x \leq 1$, $In_xGa_{1-x}N$, $0 \leq x \leq 1$ or $Al_xIn_yGa_{1-x-y}N$, $0 \leq x \leq 1$, $0$ $0 \leq x+y \leq 1$.

The semiconductor body preferably contains a plurality of nitride compound semiconductor layers. The semiconductor layers may be disposed, for example grown epitaxially, on a substrate. What are suitable for this are, in particular, radiation-transmissive substrates such as, for example, silicon carbide substrates (SiC substrates) or sapphire substrates that enable a coupling-out of radiation through the substrate.

As an alternative, the semiconductor component may be embodied without a substrate as a thin-film component. It is advantageous that absorption of the generated radiation in a substrate is thus completely avoided.

In an advantageous development of the invention, the substrate is provided with a reflector on a side opposite to the contact metallization layer. This makes it possible to utilize the reflector side as a mounting area, radiation which is emitted in the direction of this side being reflected back at least partly in the direction of the contact metallization layer with the advantageous coupling-out properties described.

In the case of a thin-film component, by contrast, the reflector is preferably disposed on the radiation-transmissive, electrically conductive contact layer. In this case, the contact layer advantageously enables a particularly high degree of reflection. The coupling-out of radiation is affected for the most part via that side of the semiconductor body that is opposite to the reflector.

In accordance with an added feature of the invention, the semiconductor body contains a plurality of semiconductor layers that are deposited epitaxially on the substrate. A counter-contact metallization layer is disposed on the substrate on a side opposite to the semiconductor body, and the substrate is electrically conductive. The semiconductor body may contain a plurality of semiconductor layers produced by an epitaxy process, a substrate used for the epitaxy process being stripped away from the semiconductor body.

In accordance with an additional feature of the invention, the semiconductor body is fixed on a carrier, and the radiation-transmissive, electrically conductive contact layer is disposed between the carrier and the semiconductor body. A reflecting interface is disposed between the carrier and the radiation-transmissive, electrically conductive contact layer. Preferably, the reflecting interface is a mirroring interface.

In accordance with another feature of the invention, the semiconductor component has a main radiation direction, and the semiconductor body has a surface disposed perpendicularly or at a predetermined angle to the main radiation direction.

In accordance with a further feature of the invention, the semiconductor component is a luminescence diode such as a light-emitting diode, a laser diode, or a vertical cavity surface emitting laser.

Other features which are considered as characteristic for the invention are set forth in the appended claims.

Although the invention is illustrated and described herein as embodied in a radiation-emitting semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic sectional view of a first exemplary embodiment of a component according to the invention;

FIG. 2A is a diagrammatic sectional view of a second exemplary embodiment of the component according to the invention; and FIG. 2B is a plan view of the second exemplary embodiment.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a semiconductor component that has a semiconductor body 1 with a plurality of nitride compound semiconductor layers 6, 7, 8. By way of example, the semiconductor body 1 may have a radiation-generating layer 8 disposed between a first cladding layer 6 and a second cladding layer 7. By way of example, GaN, AlGaN or AlInGaN may be used as a material for the cladding layers 6 and/or 7.

In order to form a single or multiple quantum well structure, the layer 8 may contain a plurality of individual layers. The radiation-generating layer 8 preferably contains AlGaN, InGaN, AlInGaN, GaN or InN.

In the case of the exemplary embodiment shown, the cladding layer 7 is n-doped and the cladding layer 6 is p-doped, so that a radiation-generating pn junction is formed between the layers in the region of the active layer 8. Silicon, for example, is suitable for the n-type doping and magnesium, for example, is suitable for the p-type doping.

The layer structure is applied to an electrically conductive substrate 5. In the case of a layer structure that is produced epitaxially, the epitaxy substrate, for example, may be used as the substrate 5. A SiC substrate is particularly suitable, this substrate being distinguished not only by its electrical conductivity but also by good lattice matching to gallium-nitride-based compounds.

If appropriate, a buffer layer may additionally be formed between the substrate 5 and the cladding layer 7, which buffer layer for example further improves the lattice matching during the epitaxy and/or reduces the electrical resistance between the semiconductor body 1 and the substrate 5.

On the side remote from the layer structure 6, 7, 8, the substrate 5 is provided with a counter-contact metallization layer 9.

A contact metallization layer 3 is disposed on the surface of the p-conducting cladding layer 6. The contact metallization layer 3 is embodied as a thin platinum or palladium layer having a thickness of less than 20 nm, preferably less than 10 nm. In the case of the exemplary embodiment shown, the thickness of the contact metallization layer is 5 nm. On account of the small thickness, such a contact metallization layer 3 is at least partly transparent to the radiation generated in the active layer 8.

However, the transverse conductivity of the contact metallization layer also decreases with the thickness of the contact metallization layer. This has the effect that an operating current impressed via a wire connection 11 and a wire pad 10 would essentially flow in a direct direction from the wire pad 10 to the counter-contact metallization layer 9.

A current expansion in the contact metallization layer 3 requires, from the contact point, a current flow parallel to the semiconductor surface 2 and would take place only to a limited extent on account of the low electrical conductivity of the contact metallization layer 3 in this direction. In addition, the electrical conductivity in the p-doped semiconductor layer 6 is also comparatively low and does not lead to a significant increase in the current expansion. The disadvantageous consequences of a resultant inhomogeneous current distribution in the semiconductor body, in particular a local thermal overload, have already been described.

In order to avoid this, in the case of the invention, the contact metallization layer 3 is covered with an electrically conductive and radiation-transmissive contact layer 4 made of zinc oxide. The contact layer 4 may be formed with a thickness that is preferably greater than 10 nm, particularly preferably greater than 100 nm, and is 200 nm, for example, and has a high transverse conductivity relative to the contact metallization layer 3. An operating current fed in via the wire pad 10 flows in the contact layer 4 initially predominantly parallel to the semiconductor surface 2 and is subsequently introduced into the semiconductor body via the contact metallization layer 3. Corresponding current paths 13 are illustrated diagrammatically in FIG. 1. As a result, a sufficient current expansion and uniform distribution is already achieved in the contact layer 4, so that a largely homogeneous lateral current distribution is present in the underlying contact metallization layer 3.

FIGS. 2A and 2B illustrate a second exemplary embodiment of the invention. FIG. 2A shows a diagrammatic sectional view, and FIG. 2B shows the associated plan view.

In contrast to the exemplary embodiment shown in FIG. 1, in the case of the second exemplary embodiment, the semiconductor component is embodied as a thin-film component and has no substrate.

In this case, for the purpose of mechanical stabilization, the semiconductor body 1 is mounted with the contact layer 4 onto a carrier 12. Expediently, the carrier 12 is electrically conductive and at the same time serves for introducing current.

Such a component can be produced for example by the semiconductor body being grown epitaxially on an epitaxy substrate, subsequently being provided with the contact metallization layer 3 and the contact layer 4 and then being fixed on the carrier 12. Afterward, the epitaxy substrate can be stripped away and a counter-contact metallization layer 9 can be applied.

The counter-contact metallization layer 9 is thus disposed directly on the semiconductor body 1 or the cladding layer 7 contained therein, which, as in the previous exemplary embodiment, may contain GaN, AlGaN or AlInGaN and/or be n-doped. The construction and composition of the active layer 8 and of the cladding layer 6 likewise correspond to the previous exemplary embodiment.

Furthermore, in contrast to the exemplary embodiment shown in FIG. 1, the counter-contact metallization layer 9 is configured as a pad for the wire connection 11 and covers the surface of the semiconductor body 1 only partly.

The carrier 12 may be a metal or a semiconductor carrier, it being advantageous to match the thermal expansion coefficient of the carrier 12 to the thermal expansion coefficient of the semiconductor body 1 in order to avoid thermally induced mechanical stresses. This is to be understood to mean that the difference between the expansion coefficients is so small that damage to the semiconductor body does not occur in the temperature range that occurs or is provided during production and in operation. Preferably, the relative deviation of the thermal expansion coefficient of the carrier 12 from the thermal expansion coefficient of the semiconductor body 1 should be less than 50%, particularly preferably less than 30%.

The contact metallization layer 3 in the form of a plurality of contact islands disposed next to one another, which are circular in the plan view 2b, is applied on the surface 2 of the semiconductor body 1, opposite to the counter-electrode 9. The radiation generated can thus pass through the regions that are not covered with the contact metallization layer 3 between the contact islands and be reflected back in the direction of the radiation coupling-out areas, as will be explained in more detail below.

The structuring of the contact metallization layer 3 into a plurality of non-contiguous contact islands results in a low degree of coverage of the semiconductor surface and consequently a high coupling-out of radiation. The thickness of the contact metallization layer 3 is chosen as in the case of the first exemplary embodiment, so that the contact islands themselves are additionally radiation-transmissive.

As an alternative, the thickness of the contact metallization layer 3 in the case of the second exemplary embodiment may also be chosen to be significantly greater than in the case of the exemplary embodiment shown in FIG. 1 since although a radiation transmissivity of the contact islands themselves is advantageous, it is not absolutely necessary.

Equally, in the case of the exemplary embodiment shown in FIG. 1, the contact metallization layer 3 may be configured in this way in the form of individual contact islands. In this case, the transverse conductivity between the contact islands is so low that additional measures that ensure a uniform current distribution are generally required. This is achieved by of the electrically conductive, radiation-transmissive contact layer 4 in the case of the invention. Zinc oxide is preferably used as material for the contact layer.

A further advantage of the embodiment of the component as a thin-film component, as illustrated in FIG. 2A, is that absorption of the generated radiation in a substrate is avoided. In particular, radiation components that are emitted in the direction of the carrier 12 can thus also be utilized efficiently.

Preferably, a reflector layer 14 having a degree of reflection that is as high as possible is disposed on the contact layer 4, and the semiconductor body is mounted with the reflector layer 14 onto the carrier 12. As an alternative, the carrier 12 itself may also be embodied to be reflecting, preferably mirroring. In both cases, radiation components that are emitted in the direction of the carrier 12 are reflected back in the direction of the radiation coupling-out areas, as a result of which the radiation efficiency is increased.

In this case, covering the contact metallization layer 3 with the radiation-transmissive, electrically conductive contact layer 4 facilitates the formation of an interface with a high degree of reflection. This degree of reflection is significantly greater than the degree of reflection that can usually be achieved at the interface between semiconductor body and contact metallization layer.

It goes without saying that, in the case of the two exemplary embodiments, it is also possible to use other radiation-generating structures, for example also a two-layered construction with a p-conducting and an n-conducting layer with a pn junction lying in between, or a VCSEL structure (vertical cavity surface emitting laser).

The invention is advantageous particularly in the case of a VCSEL, which, on account of the comparatively high operating current, requires a homogeneous current distribution, a low contact resistance and a low-loss coupling-out of radiation perpendicular to the semiconductor layers.

It goes without saying that the explanation of the invention on the basis of the exemplary embodiments described is not to be understood as a restriction of the invention. In particular, individual features of the exemplary embodiments may also be combined in a different way.

We claim:

1. A radiation-emitting semiconductor component, comprising:
    a semiconductor body containing a nitride compound semiconductor and having a surface;
    a contact metallization layer disposed on said surface of said semiconductor body, said contact metallization layer being radiation-transmissive; and
    a radiation-transmissive, electrically conductive contact layer at least partly covering said contact metallization layer,
    wherein said semiconductor body contains a plurality of semiconductor layers produced by an epitaxy process, but without a substrate used for the epitaxy process, such substrate having been stripped away from said semiconductor body after the epitaxy process.

2. The radiation-emitting semiconductor component according to claim 1, wherein said nitride compound semiconductor is a nitride compound of elements selected from the group consisting of a third main group and a fifth main group of the periodic table.

3. The radiation-emitting semiconductor component according to claim 1, wherein said nitride compound semiconductor contains at least one compound selected from the group consisting of GaN, AlN, InN, $Al_xGa_{1-x}N$, $0 \leq x \leq 1$, $In_xGa_{1-x}N$, $0 \leq x \leq 1$ and $Al_xIn_yGa_{1-x-y}N$, $0 \leq x \leq 1$, $0 \leq y \leq 1$, $0 \leq x+y \leq 1$.

4. The radiation-emitting semiconductor component according to claim 1, wherein an electrical conductivity in a parallel direction with respect to said surface of said semiconductor body is greater in said radiation-transmissive, electrically conductive contact layer than in said contact metallization layer.

5. The radiation-emitting semiconductor component according to claim 1, wherein said contact metallization layer contains a material selected from the group of palladium and platinum.

6. The radiation-emitting semiconductor component according to claim 1, wherein said contact metallization layer has a layer thickness of less than 20 nm.

7. The radiation-emitting semiconductor component according to claim 1, wherein said contact metallization layer has a layer thickness of less than 10 nm.

8. The radiation-emitting semiconductor component according to claim 1, wherein said semiconductor body has a p-doped region with a surface and said contact metallization layer is applied to said surface of said p-doped region.

9. The radiation-emitting semiconductor component according to claim 8, wherein said p-doped region is doped with a material selected from the group consisting of magnesium and zinc.

10. The radiation-emitting semiconductor component according to claim 1, wherein said radiation-transmissive, electrically conductive contact layer contains zinc oxide.

11. The radiation-emitting semiconductor component according to claim 1, wherein said radiation-transmissive, electrically conductive contact layer contains a material selected from the group consisting of indium oxide, tin oxide and indium tin oxide.

12. The radiation-emitting semiconductor component according to claim 1, further comprising a substrate and said semiconductor body is disposed on said substrate.

13. The radiation-emitting semiconductor component according to claim 12, wherein said substrate is radiation-transmissive.

14. The radiation-emitting semiconductor component according to claim 12, wherein said substrate contains a material selected from the group consisting of silicon carbide and sapphire.

15. The radiation-emitting semiconductor component according to claim 12, wherein said semiconductor body contains a plurality of semiconductor layers which are deposited epitaxially on said substrate.

16. The radiation-emitting semiconductor component according to claim 12, further comprising a counter-contact metallization layer disposed on said substrate on a side opposite to said semiconductor body, and said substrate is electrically conductive.

17. The radiation-emitting semiconductor component according to claim 1, further comprising a carrier, and said semiconductor body is fixed on said carrier, said radiation-transmissive, electrically conductive contact layer disposed between said carrier and said semiconductor body.

18. The radiation-emitting semiconductor component according to claim 17, further comprising a reflecting interface disposed between said carrier and said radiation-transmissive, electrically conductive contact layer.

19. The radiation-emitting semiconductor component according to claim 18, wherein said reflecting interface is a mirroring interface.

20. The radiation-emitting semiconductor component according to claim 1, further comprising a counter-contact metallization layer disposed on said semiconductor body on a side opposite to said radiation-transmissive, electrically conductive contact layer.

21. The radiation-emitting semiconductor component according to claim 1, wherein said semiconductor component is a thin-film component.

22. The radiation-emitting semiconductor component according to claim 1, wherein:
    said semiconductor component has a main radiation direction; and
    said semiconductor body has a surface disposed one of perpendicularly and at a predetermined angle to said main radiation direction.

23. The radiation-emitting semiconductor component according to claim 1, wherein the semiconductor component is a luminescence diode.

24. The radiation-emitting semiconductor component according to claim 23, wherein said luminescence diode is selected from the group consisting of a light-emitting diode and a laser diode.

25. The radiation-emitting semiconductor component according to claim 23, wherein the semiconductor component is a vertical cavity surface emitting laser.

26. A radiation-emitting semiconductor component, comprising:
    a semiconductor body containing a nitride compound semiconductor and having a surface;
    a contact metallization layer disposed on said surface of said semiconductor body, said contact metallization layer having a plurality of openings formed therein defining a plurality of contact islands spaced apart from one another; and a radiation-transmissive, electrically conductive contact layer at least partly covering said contact metallization layers, wherein said semiconductor body contains a plurality of semiconductor layers produced by an epitaxy process, but without a substrate used for the epitaxy process, such substrate having been stripped away from said semiconductor body after the epitaxy process.

27. The radiation-emitting semiconductor component according to claim 26, wherein said contact islands are radiation-transmissive.

28. The radiation-emitting semiconductor component according to claim 26, wherein said nitride compound semiconductor is a nitride compound of elements selected from the group consisting of a third main group and a fifth main group of the periodic table.

29. The radiation-emitting semiconductor component according to claim 26, wherein said nitride compound semiconductor contains at least one compound selected from the group consisting of GaN, AlN, InN, $Al_xGa_{1-x}N$, $0<x<1$, $In_xGa_{1-x}N$, $0<x<1$ and $Al_xIn_yGa_{1-x-y}N$, $0<x<1$, $0<y<1$, $0<x+y<1$.

30. The radiation-emitting semiconductor component according to claim 26, wherein an electrical conductivity in a parallel direction with respect to said surface of said semiconductor body is greater in said radiation-transmissive, electrically conductive contact layer than in said contact metallization layer.

31. The radiation-emitting semiconductor component according to claim 26, wherein said contact metallization layer contains a material selected from the group of palladium and platinum.

32. The radiation-emitting semiconductor component according to claim 26, wherein said contact metallization layer has a layer thickness of less than 20 nm.

33. The radiation-emitting semiconductor component according to claim 26, wherein said contact metallization layer has a layer thickness of less than 10 nm.

34. The radiation-emitting semiconductor component according to claim 26, wherein said semiconductor body has a p-doped region with a surface and said contact metallization layer is applied to said surface of said p-doped region.

35. The radiation-emitting semiconductor component according to claim 34, wherein said p-doped region is doped with a material selected from the group consisting of magnesium and zinc.

36. The radiation-emitting semiconductor component according to claim 26, wherein said radiation-transmissive, electrically conductive contact layer contains zinc oxide.

37. The radiation-emitting semiconductor component according to claim 26, wherein said radiation-transmissive, electrically conductive contact layer contains a material selected from the group consisting of indium oxide, tin oxide and indium tin oxide.

38. The radiation-emitting semiconductor component according to claim 26, further comprising a carrier, and said semiconductor body is fixed on said carrier, said radiation-transmissive, electrically conductive contact layer is disposed between said carrier and said semiconductor body.

39. The radiation-emitting semiconductor component according to claim 38, further comprising a reflecting interface disposed between said carrier and said radiation-transmissive, electrically conductive contact layer.

40. The radiation-emitting semiconductor component according to claim 39, where said reflecting interface is a mirroring interface.

41. The radiation-emitting semiconductor component according to claim 26, further comprising a counter-contact metallization layer disposed on said semiconductor body on a side opposite to said radiation-transmissive, electrically conductive contact layer.

42. The radiation-emitting semiconductor component according to claim 26, wherein said semiconductor component is a thin-film component.

43. The radiation-emitting semiconductor component according to claim 26, wherein:

said semiconductor component has a main radiation direction; and said semiconductor body has a surface disposed one of perpendicularly and at a predetermined angle to said main radiation direction.

44. The radiation-emitting semiconductor component according to claim 26, wherein the semiconductor component is a luminescence diode.

45. The radiation-emitting semiconductor component according to claim 44, wherein said luminescence diode is selected from the group consisting of a light-emitting diode and a laser diode.

46. The radiation-emitting semiconductor component according to claim 44, wherein the semiconductor component is a vertical cavity surface emitting laser.

47. The radiation-emitting semiconductor component of claim 1, wherein said contact metallization layer is a closed layer.

48. The radiation-emitting semiconductor component of claim 1, wherein said contact metallization layer is a thin layer, the radiation transmissiveness of said contact metallization layer being attributable, at least in part, to the thinness of said contact metallization layer.

* * * * *